(12) United States Patent
Jinbo et al.

(10) Patent No.: US 6,342,702 B1
(45) Date of Patent: Jan. 29, 2002

(54) ULTRAVIOLET RAY IRRADIATION APPARATUS

(75) Inventors: Yosuke Jinbo; Satoru Amano, both of Tokyo (JP)

(73) Assignee: Hoya-Schott Corporation, Tokyo (JP)

( * ) Notice: Subject to any disclaimer, the term of this patent is extended or adjusted under 35 U.S.C. 154(b) by 0 days.

(21) Appl. No.: 09/447,262

(22) Filed: Nov. 23, 1999

(30) Foreign Application Priority Data

Nov. 25, 1998 (JP) ............................................. 10-334162
Nov. 15, 1999 (JP) ............................................. 11-323597

(51) Int. Cl.[7] ............................ G01J 1/00; H01J 37/302
(52) U.S. Cl. .............................. 250/492.1; 250/492.23; 250/492.22; 250/504 R
(58) Field of Search ......................... 250/491.1, 492.21, 250/504 R, 498.1

(56) References Cited

U.S. PATENT DOCUMENTS 5,477,054 A * 12/1995 Tateosian et al. .......... 250/492.1
5,872,365 A *  2/1999 Goh et al. ................ 250/492.1
6,015,976 A *  1/2000 Hatakeyama et al. .. 250/492.23

FOREIGN PATENT DOCUMENTS

JP            9-92634           4/1997

* cited by examiner

Primary Examiner—Bruce Anderson
Assistant Examiner—Anthony Quash
(74) Attorney, Agent, or Firm—Sughrue Mion, PLLC (57) ABSTRACT

An ultraviolet ray irradiation apparatus has a turntable which mounts a substance to be processed, a driving source which rotates and drives the turntable, a filter which adjusts light quantity of an ultraviolet light beam that reaches a surface to be processed of a substance W to be processed in accordance with shapes of an ultraviolet beam passing region. In the filter, the shape of the ultraviolet light beam passing region is symmetrical for a center line for a length direction of the irradiating range of the ultraviolet light beam. At least a portion near a center of the irradiating range of the ultraviolet light beam of each line segment that forms a boundary of the ultraviolet light beam passing region in a width direction of the ultraviolet light beam passing region is substantially expressed by a quadratic curve that a distance r in the length direction of the irradiating range of the ultraviolet light beam on the basis of the center line is variable.

7 Claims, 7 Drawing Sheets

ULTRAVIOLET RAY IRRADIATION APPARATUS

BACKGROUND OF THE INVENTION

This invention relates to an ultraviolet ray irradiation apparatus by the use of a dielectric barrier discharge lamp (may be referred to as an excimer lamp) which washes and modifies a surface of semiconductor, metal, or macromolecular compound and the like.

The dielectric barrier discharge lamp (excimer lamp) has different wavelength with respect to emitted light beams in accordance with the kinds of gases sealed in a lamp tube. For example, a light beam having center wavelength of 172 nm, 222 nm and 308 nm is emitted when a sealed gas is xenon, krypton chloride, and xenon chloride, respectively.

In particular, the dielectric barrier discharge lamp sealed with the xenon emits a light beam having wavelength of 172 nm as a vacuum ultraviolet light beam. To this end, when irradiation is carried out in atmosphere containing oxygen, oxygen molecular ($O_2$) absorbs the light beam, and generates active oxygen species, such as, oxygen atom (O) and ozone ($O_3$).

Further, photon energy of a light beam having wavelength of 172 nm is about 7.2 eV, and is higher than combination energy of a plurality of organic substances. In consequence, chemical bonds of organic compound can be cut by irradiating the light beam of 172 nm, and oxidation decomposition removal can be performed by the generated active oxygen species.

This method has been known as an UV ozone cleaning method, and been widely applied in a manufacturing process of a semiconductor integrated circuit or liquid crystal as an organic substance washing method. Further, practical use has been proceeded as a method for removing metal contamination about a method for generating chlorine radical by irradiating the ultraviolet light beam to chlorine gas, for generating chloride by reacting the chlorine radical with metal attached to a substrate surface, and for volatilizing and removing by utilizing difference of vaporizing pressure, or a method for irradiating the ultraviolet light beam to gas containing fluorine and for removing a natural oxide film on a silicon wafer by the generated fluorine radical.

The semiconductor integrated circuit is increased in its integration every year, and a permitted level of the organic compound contamination is also enhanced in a manufacturing process of the integrated circuit. Recently, the silicon wafer as the substrate of the integrated circuit mainly has a diameter of 200 mm, and a diameter of 300 mm has been gradually applied.

Figure 1A:
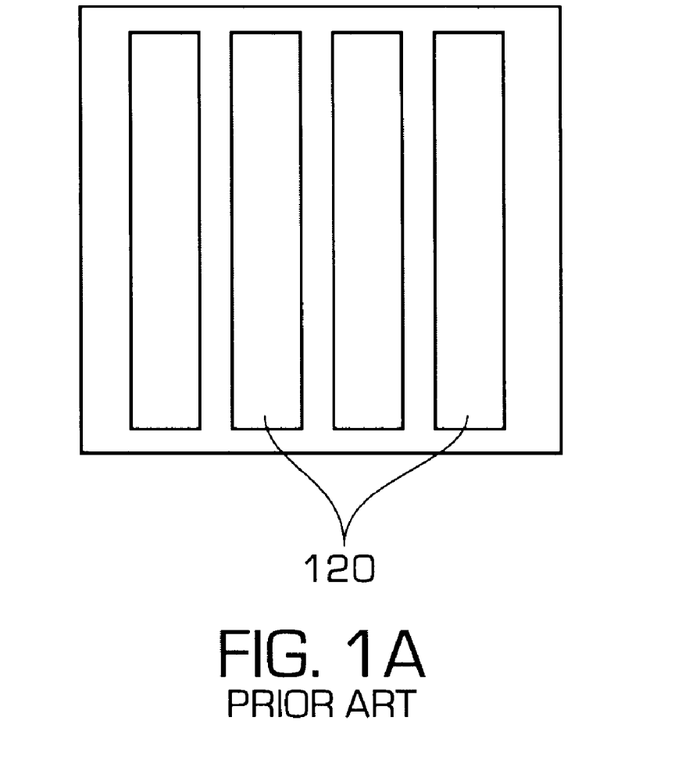
FIG. 1A and FIG. 1B are a plan view and a side view showing an example of the conventional ultraviolet ray irradiation apparatus.
Figure 1B:
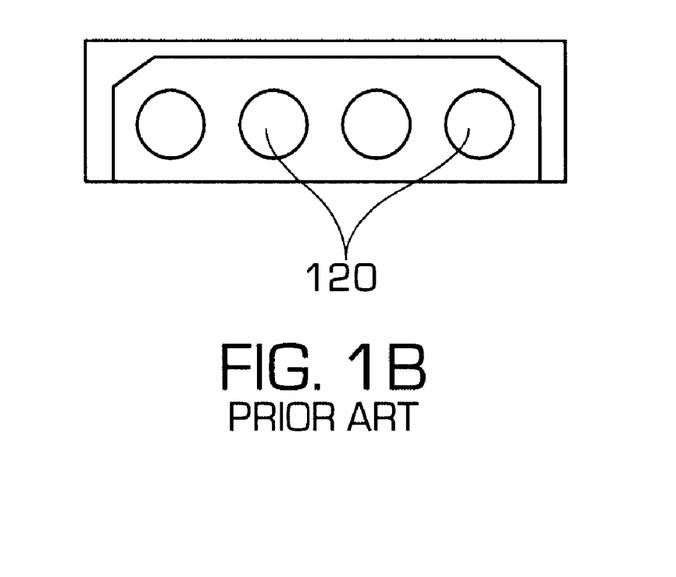

When the dielectric barrier discharge lamp is used to remove the organic substance contamination, a plurality of dielectric barrier discharge lamps must be arranged so as to irradiate the light beam into substrates having these sizes. For example, an apparatus, in which a plurality of lamps 120 having a length of 230 mm are used with desired spaces, has been commercially used as the ultraviolet ray irradiation apparatus for the silicon wafer having the diameter of 200 mm, as illustrated in FIG. 1A and FIG. 1B. In the ultraviolet ray irradiation apparatus of such a surface irradiating block system, as a size of a substance to be processed and be irradiated is larger, the number of the lamps is higher from necessity for irradiating the light beam throughout the substance to be processed.

However, when the number of the lamps is plural as an example illustrated in FIG. 1, it is necessary to replace old lamps due to the lamps' lifetime with a required number of new lamps.

Further, if a plurality of lamps are used, the same number of lamp driving (lightning) circuits are required, and cost thereof becomes excessively high. Moreover, looking at plural lamps in terms of uniformity of irradiation, intensity of irradiated light beams differs directly under the lamps and in-between the lamps. Therefore, even if a reflection mirror is provided, nonuniformity of light quantity inevitably takes place for the light beam irradiated into the substance to be processed.

There is a method for performing irradiation by lineally scanning the substance to be processed or the dielectric barrier discharge lamp by the use of a single dielectric barrier discharge lamp as means for solving such a problem. The cost for the replacement due to the lamp lifetime can be reduced in this method because only single dielectric barrier discharge lamp is used. In addition, the light quantity of the light beam irradiated into the substance to be processed can be uniform because the single lamp is lineally scanned.

However, the ultraviolet light beam must be irradiated for an entire region of the substance to be processed in the method for lineally scanning the substance or the lamp. Consequently, a distance for scanning them must be equal or more to the diameter of the substance to be processed.

Further, a supporting mechanism, such as, a guide rail, becomes necessary at both sides thereof because the dielectric barrier discharge lamp is lineally scanned. As a result, the apparatus becomes large and expensive.

Moreover, it is difficult to tightly cover between the dielectric barrier discharge lamp and the substance to be processed, and is difficult to use corrosive gas, such as, chlorine gas and fluorine gas.

Due to the above-mentioned reasons, suggestion has been made about an apparatus in which the substance to be processed is rotatably supported on a supporting stand, and a process is carried out by relatively rotating the substance for the dielectric barrier discharge lamp (for example, see Japanese Unexamined Patent Publication (JP-A) No. H09-92634).

An apparatus structure can be simplified in the conventional apparatus in comparison with the case that the dielectric barrier discharge lamp is lineally scanned. Thereby, downsizing of the apparatus becomes possible.

On the other hand, when the ultraviolet light beam is given for the substance to be processed by rotating the irradiating range, a relative speed between the substance and the lamp is variable in accordance with a distance from the rotating center. Therefore, when irradiating light quantity for a length direction of the dielectric barrier discharge lamp is constant, as the distance from the rotating center becomes larger, the integrating light quantity for the surface of the substance becomes smaller. As a result, the surface process can not be uniformly carried out.

To solve this problem, a light shielding plate, in which a region (hereinafter, referred to as an ultraviolet light passing region) for passing the ultraviolet light beam of substantially triangle shape is formed, is arranged in a method described in FIG. 5 and description in the above-mentioned Japanese Unexamined Patent Publication (JP-A) No. H09-92634. Thereby, the integrating light quantity of the ultraviolet light beam, which reaches the surface of the substance to be processed, is adjusted in accordance with the distance from the rotating center.

However, when the irradiation of the ultraviolet light beam is performed through the above-mentioned ultraviolet light passing region of the triangle shape, it has been confirmed by inventor's experiment that the integrating light quantity on the surface of the substance to be processed does not accurately become constant in accordance with the distance from the rotating center.

Figure 4A:
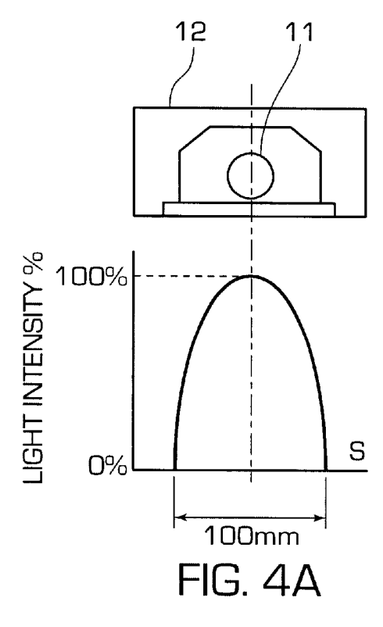
FIG. 4A and FIG. 4B are diagrams showing light intensity distribution of a dielectric barrier discharge lamp.

This is because the light intensity for width direction of the dielectric barrier discharge lamp 11 distributes to an angled shape, and is not constant, as illustrated in FIG. 4A. In the experiment, such a result that the integrating light quantity becomes smaller in accordance with the distance from the rotating center has been obtained. From this fact, when the shielding plate of the triangle shape is used, the uniform surface process can not be performed.

SUMMARY OF THE INVENTION

It is therefore an object of this invention to provide an ultraviolet ray irradiation apparatus which is capable of approaching integrating light quantity of an ultraviolet light beam for a surface of a substance to be processed constant when an ultraviolet light beam is irradiated by relatively rotating the substance for a dielectric barrier discharge lamp, and thereby, enhancing uniformity of a surface process.

To achieve the above-mentioned object, an ultraviolet ray irradiation apparatus which performs washing and modification by irradiating an ultraviolet beam for a surface to be processed of an substance to be processed according to this invention comprises a dielectric barrier discharge lamp which has a length of a maximum diameter of the surface or more, a turntable which mounts the substance such that the surface is placed under irradiation of the ultraviolet light beam irradiated by the dielectric barrier discharge lamp, a rotation center thereof substantially corresponding to a center of an irradiating range of the ultraviolet light beam due to the dielectric barrier discharge lamp, a driving source which rotates and drives the turntable, and a filter which is fixed under the irradiation of the ultraviolet light beam due to the dielectric barrier discharge lamp and which adjusts light quantity of the ultraviolet light beam that reaches the surface of the substance in accordance with shapes of an ultraviolet beam passing region, the shape of the ultraviolet light beam passing region being symmetrical for a center line for a length direction of the irradiating range of the ultraviolet light beam, and at least a portion near a center of the irradiating range of the ultraviolet light beam of each line segment that forms a boundary of the ultraviolet light beam passing region in a width direction of the ultraviolet light beam passing region being substantially expressed by a quadratic curve that a distance r in the length direction of the irradiating range of the ultraviolet light beam on the basis of the center line is variable.

Whereby, the irradiation due to the dielectric barrier discharge lamp is performed by relatively rotating the substance for the dielectric barrier discharge lamp. Thereby, the ultraviolet light beam is irradiated from the dielectric barrier discharge lamp for an entire region of the surface.

In this case, at least the portion near the center of the irradiating range of the ultraviolet light beam of each line segment that forms the boundary of the ultraviolet light beam passing region in the width direction of the ultraviolet light beam passing region is preferably given by a curve m(r) which is based on the center line for the width direction of the irradiating range of the ultraviolet light beam and in which extension thereof passes near the center of the irradiating range, integrating light quantity E (r) given by the following equation in a direction along the center line being substantially constant, $$E(r) = \frac{t \cdot \int_0^{m(r)} [4 \cdot P(s)] ds}{2\pi r} \quad (1)$$

P(s): light intensity of the dielectric barrier discharge lamp;

s: a distance in a width direction from an axis line of the dielectric barrier discharge lamp;

r: a distance from the rotation center of the substance.

Further, it is preferable that the line segments that form the boundary in the width direction of the ultraviolet light beam passing region does not reach the center of the irradiating range of the ultraviolet light beam, and are combined by adjacent line segments to each other in the width direction of the ultraviolet light beam passing region, thereby, two ultraviolet light beam passing regions apart with desired distance being formed at both sides of the center of the irradiating region.

Moreover, the ultraviolet light beam passing region is preferably a slit which is opened in the filter.

This invention further comprises at least a process chamber which tightly covers the irradiating range of the ultraviolet light beam due to the dielectric barrier discharge lamp from an external.

This invention further comprises a body of equipment which contains at least the turntable and the driving source, an upper side thereof being opened, and a cover which is attached so as to open and close the opening for the body and which is fixed with at least the dielectric barrier discharge lamp and the filter.

In this event, the process chamber, which is tightly covered from the external, is preferably formed by closing the cover for the body.

DESCRIPTION OF PREFERRED EMBODIMENT

Hereinafter, description will be made about an embodiment of this invention with drawings.

Description will be hereinafter made about this invention by exemplifying an ultraviolet ray irradiation apparatus which washes and modifies a surface thereof by irradiating an ultraviolet light beam for a silicon wafer of 300 mm as a substance to be processed.

Figure 2A:
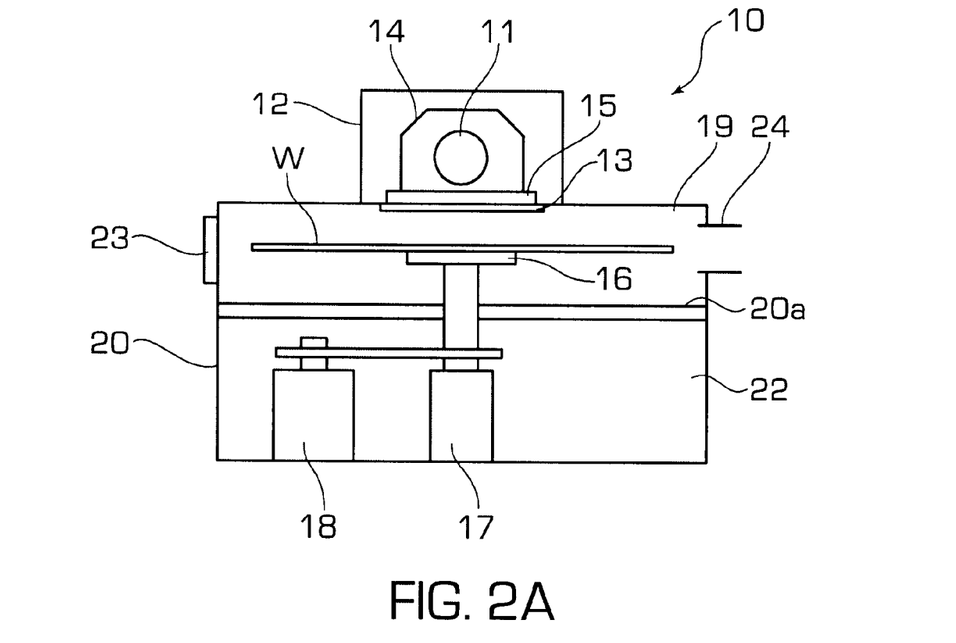
FIG. 2A and FIG. 2B are a front view and a side view showing a schematic structure of an ultraviolet ray irradiation apparatus according to this invention.
Figure 2B:
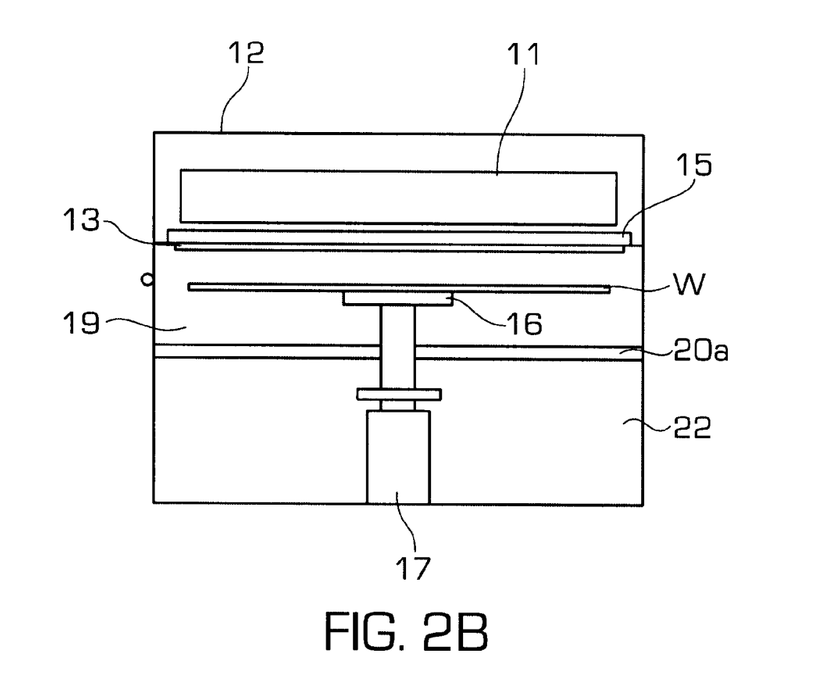

As illustrated in FIG. 2A and FIG. 2B, an ultraviolet ray irradiation apparatus 10 according to this invention includes a lamp house 12 having a dielectric barrier discharge lamp 11 (an excimer lamp) inside. The lamp house 12 is a tightly covered container, and is filled with inactive gas, such as, nitrogen and argon which do not readily absorb a light beam inside. Thereby, it is prevented the ultraviolet light beam from the dielectric barrier discharge lamp 11 from decaying in the lamp house 12. The dielectric barrier discharge lamp 11 provided in the lamp house 12 has a substantially cylindrical shape, and emits the ultraviolet light beam from a circumferential surface thereof.

In one embodiment, sealed gas inside the lamp tube is xenon, and emits the ultraviolet light beam of 172 nm. Naturally, neon fluoride (108 nm), argon (126 nm), krypton (146 nm), fluorine(154 nm), argon chloride (175 nm), argon fluoride (193 nm) may be, for example, filled and used as the alternative sealed gas in this invention.

Further, krypton chloride (222 nm), krypton fluoride (248 nm), xenon fluoride (308 nm), and xenon fluoride (351 nm) may be filled and used as a luminescent region of the ultraviolet light beam.

A light transmitting member 13 is provided as a light output window at a lower surface of the lamp house 12. The ultraviolet light beam emitted from the dielectric barrier discharge lamp 11 transmits the light transmitting member 13, and is irradiated into a substance W to be processed.

It is preferable to use quartz glass having excellent light transmitting performance in a wide wavelength region as the light transmitting member 13. Further, the lamp house 12 is provided with a reflection mirror 14 inside. The reflection mirror 14 covers an upper portion and a side portion of the dielectric barrier discharge lamp 11, and focuses the light beam irradiated into an upper direction and a side direction of the dielectric barrier discharge lamp 11 downward, namely, towards the substance W to be processed.

A modulated light filter 15 is provided on an upper portion of the light transmitting member 13. The modulated light filter 15 adjusts integrating light quantity irradiated into a side of the substance W in a length direction of the dielectric barrier discharge lamp 11. Description will be later made about a specific structure and function of the modulated light filter 15. Further, the ultraviolet ray irradiation apparatus 10 has a circular turntable 16 for arranging and fixing the substance W under the lamp house 12.

The turntable 16 can rise and fall by an elevating device 17 thereunder, and can rotate by a rotation motor 18. The substance W transferred into a process chamber 19 by lowering the turntable 16 by the elevating device 17 can be equipped on the turntable 16. After the substance W is equipped, the turntable 16 rises, and a surface to be processed of the substance W closely reaches the light transmitting member 13. In this state, the rotation motor 18 is driven, and the substance W on the turntable 16 is rotated at predetermined speed and is processed by the ultraviolet light beam of the dielectric barrier discharge lamp 11.

Carrying-in and carrying-out of the substance W for the process chamber 19 are carried out via a gate valve 23 formed in a body 20 of equipment described later. Further, it is desirable that a distance between a lower surface of the light transmitting member 13 and a surface of the turntable during the fall of the turntable 16 falls within the range between about 10 and 50 mm in one embodiment. Moreover, it is preferable that a distance between the lower surface of the light transmitting member 13 and the surface of the substance W on the turntable during the rise of the turntable 16 falls within the range between about 2 and 5 mm. In addition, it is preferable that the rotation number of the turntable due to the rotation motor 18 falls within the range between about 10 and 50 rpm.

It is preferable that at least the turntable 16 and the substance W provided thereon are arranged in the process chamber 19 tightly covered. This is to prevent ozone gas and the like generated by irradiating the ultraviolet light beam from leaking to the external in order to assure safety thereof. Further, a gas inlet into the process chamber 19 may be provided, and an internal wall of the process chamber 19 may be covered with fluorine resin material, such as, a Teflon sheet, and thereby, corrosive gas, such as, chlorine gas and fluorine gas containing no oxygen fluid can be filled in the process chamber 19 (when an object to be removed by irradiating the ultraviolet light beam is only inorganic material). The ozone gas in the process chamber 19 is exhausted and processed from an exhausting duct 24.

Figure 3:
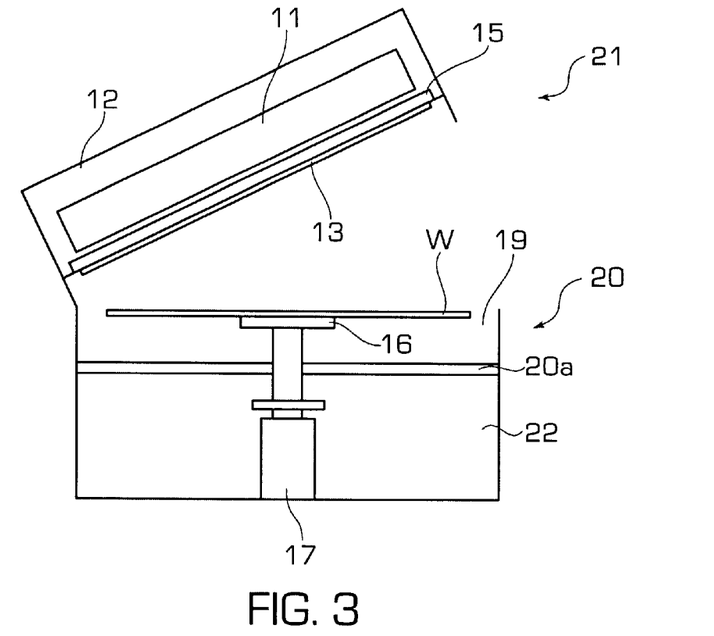
FIG. 3 is a schematic side view showing an ultraviolet ray irradiation apparatus in condition that a cover is opened.

An outer shape of the ultraviolet ray irradiation apparatus 10 is composed of the body 20 of equipment and the cover 21, as schematically illustrated in FIG. 3. The body 20 is basically opened at an upper side, and is provided with the turntable 16, the elevating device 17, and the rotation motor 18 inside.

A mechanical chamber 22 provided with the elevating device 17 and the rotation motor 18 is hermetically separated from the process chamber 19 which processes the substance W via a separation wall 20a.

On the other hand, the cover 21 is attached so as to open or close an opening thereof by a hinge for the body 20. When the cover 21 is closed, a contacting portion between the body 20 and the cover 21 is completely and closely attached. Thereby, the process chamber 19, which is tightly covered from the external, is formed.

The lamp house 12 including the dielectric barrier discharge lamp 11 is arranged on the cover 21. A region corresponding to the light transmitting member 13 on the cover 21 is opened. Thereby, the ultraviolet light beam from the dielectric barrier discharge lamp 11 can reach inside the process chamber 19. Maintenance inside the apparatus including the lamp house 12 becomes excessively easy by releasing the cover 21 from the body 20.

As illustrated in FIG. 2, a rotation center of the turntable 16 or the substance W is corresponded to a center of the dielectric barrier discharge lamp 11, namely a center in a width direction and a center in a length direction thereof. As described later, the ultraviolet light beam irradiated from the dielectric barrier discharge lamp 11 has an irradiating range of a strip shape for a surface of the substance W. Accordingly, the surface of the substance W passes under the irradiating range by the rotation of the turntable 16, and thereby, it is possible to irradiate the ultraviolet light beam along an entire surface.

Figure 4B:
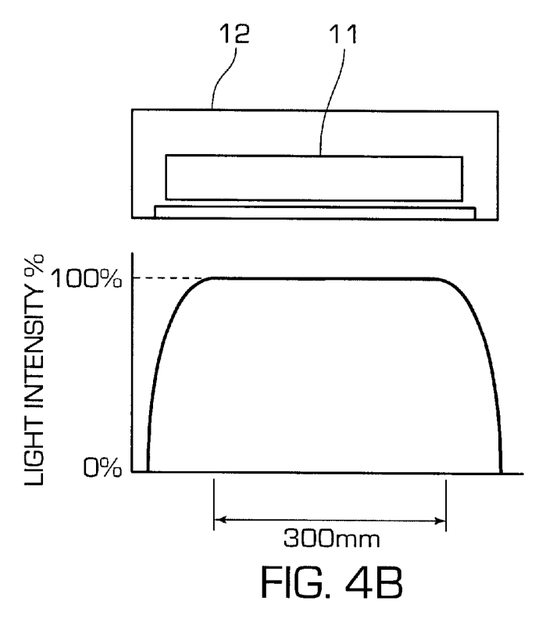

Light intensity of the dielectric barrier discharge lamp 11 is maximum at a center region thereof, and becomes weaker in accordance with a distance from the center region, as illustrated in FIG. 4. Suppose the silicon wafer of 300 mm is used as the substance W, it is necessary that a size of the used dielectric barrier discharge lamp 11 is selected such that the wafer of 300 mm falls in such a range that the intensity of the dielectric barrier discharge lamp 11 becomes maximum, as illustrated in FIG. 4B.

Naturally, a distribution width of the light intensity illustrated in FIG. 4A is not much of a problem in the size with respect to the substance W. This is because the ultraviolet light beam is uniformly irradiated for the entire region of the substance W by the rotation of the turntable 16 and an operation of the modulated light filter 15 described later irrespective of the distribution width. Description will be later made about a relationship between the opening width and the distribution width of the modulated light filter 15.

Figure 5A:
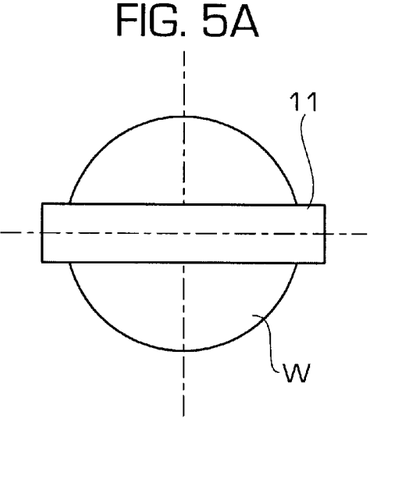
FIG. 5 is a diagram showing a plan positioning relationship of a dielectric barrier discharge lamp for a substance to be processed.
Figure 5B:
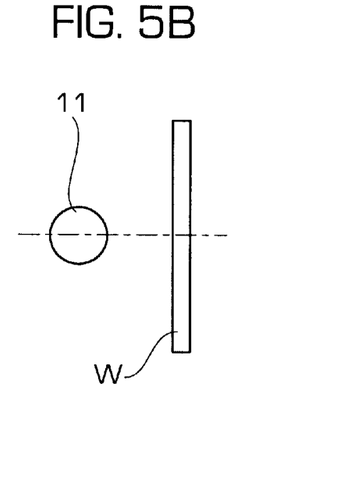

As illustrated in FIG. 5, the substance W is provided on the turntable by corresponding a substantial center of the substance W of a circular shape to the center of the dielectric barrier discharge lamp 11.

As apparent from FIG. 5, a length of the dielectric barrier discharge lamp 11 is longer than a diameter of the substance W. Thereby, the uniform irradiation of the ultraviolet light beam is assured for the entire surface of the substance W.

In the case of this embodiment, it is possible to irradiate the ultraviolet light beam for the entire region of the substance W by rotating the substance W in halfway round.

Figure 6:
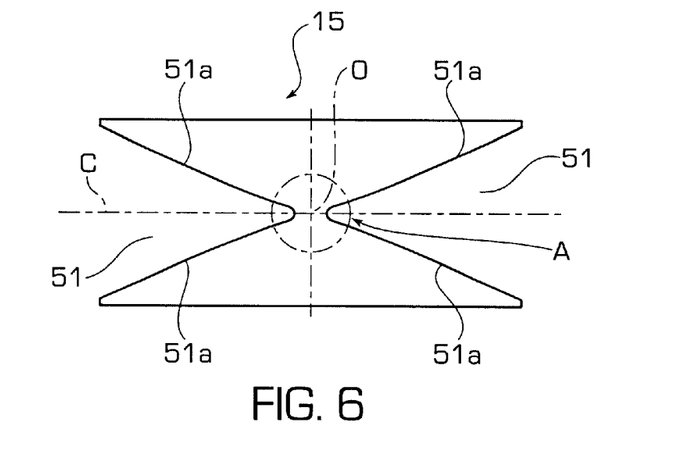
FIG. 6 is a plan view showing an embodiment of a modulated light filter.
Figure 7:
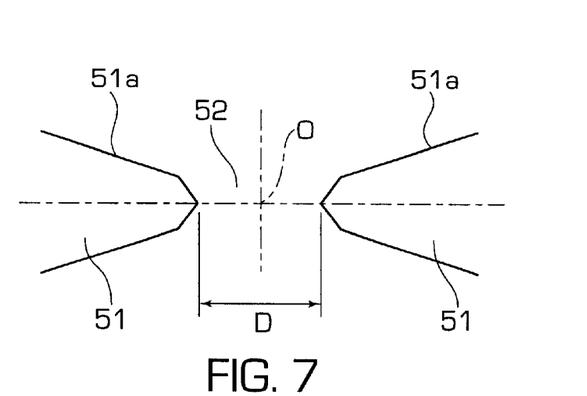
FIG. 7 is a partial enlarged diagram of a portion A in FIG. 6.
Figure 8:
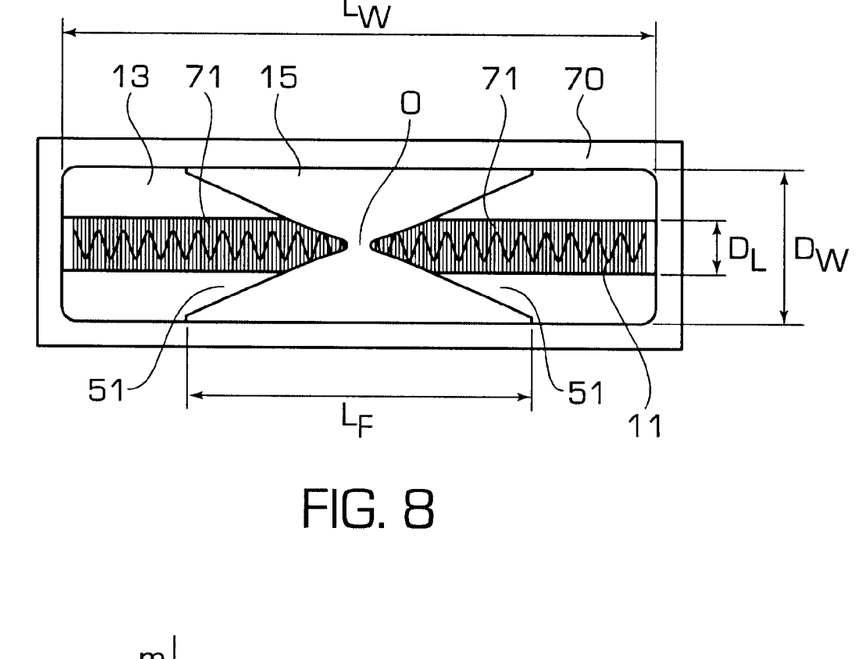
FIG. 8 is a plan view showing an arranging manner of a modulated light filter in FIG. 6.

Subsequently, description will be made about a specific structure and function of the modulated light filter 15 in FIG. 2. The modulated light filter 15 illustrated in FIG. 6 through FIG. 8 is provided with two angled slits 51 having an arbitrary opening angle for non-light transmitting member, such as, metal. Both angled slits 51 are arranged at a position as a rotation center of the substance W, namely at a position symmetrical in point to each other on the basis of a center O of the member.

The both sides of each angled slit 51 are released. Line segments 51 a at the both sides, which specify each angled slit 51, are structured by a quadratic curve curved inside the slit. The shape of the line segment 51 a is excessively important to set integrating light quantity of the ultraviolet light beam at each point, which is irradiated from the dielectric barrier discharge lamp 11 and reaches the substance W through the angled slit 51 of the modulated light filter 15, substantially constant irrespective of the area. Description will be later made about a specific shape of the line segment 51a consisting of the quadratic curve.

Extension towards a center portion of the quadratic curve 51a constituting the line segment 51 a passes the center O. However, each line segment 51 a does not reach the center O, and is combined on this side, as illustrated in FIG. 7. Thereby, tips of the two angled slits 51 are separated with a desired space D. As a result, the ultraviolet light beam towards a region 52 therebetween does not reach the substance W.

However, a part of the ultraviolet light beam towards near the tip of each angled slit 51 enters into a rear side of the region 52 by diffraction phenomenon of the light beam, and is irradiated for a region corresponding to the substance W, namely, a region near the rotation center. A width D of the region 52 can be adjusted such that the integrating light quantity of the ultraviolet light beam irradiated for the region near the rotation center becomes the same degree as the integrating light quantity of the other region.

The modulated light filter 15 is arranged between the dielectric barrier discharge lamp 11 and the light transmitting member 13. As illustrated in FIG. 8, the light transmitting member 13 is supported by a frame 70 which specifies the transmitting range of the light beam. An axis line of the dielectric barrier discharge lamp 11 is corresponded with a center of a width direction of the light transmitting member 13 of this rectangular shape. The modulated light filter 15 is arranged by overlapping thereon such that the center O corresponds with the center of the light transmitting member 13. An ultraviolet light beam passing region 71, which is surrounded by the line segment 51 a constituting the angled slit and an internal wall of the frame 70, is formed by arranging the modulated light filter 15 on the light transmitting member 13.

As apparent in FIG. 8, the ultraviolet light beam irradiated from the dielectric barrier discharge lamp 11 is not restricted by the modulated light filter 15 at both sides of the lamp, and is projected to a side of the light transmitting member 13, namely to a side of the substance W. However, a part thereof is restricted by this near the center, and can not reach the substance W. Thereby, when the irradiation of the ultraviolet light beam is carried out by relatively rotating the substance W for the dielectric barrier discharge lamp 11, the integrating light quantity of the ultraviolet light beam at each point on the substance W becomes substantially uniform.

Further, it is preferable in the modulated light filter 15 that material (for example, stainless steel), which does not corrode by the ultraviolet light beam from the dielectric barrier discharge lamp 11, is selected, and a surface process is performed. The modulated light filter 15 can be formed by plating by nickel and the like for the modulated light filter 15 or by the use of fluorine resin, such as, Teflon. Although there is no limitation with respect to a thickness of the modulated light filter 15 in order to achieve the object of this invention, it should be 1 mm or less, preferably, should be about 0.5 mm.

Subsequently, description will be made about a specific shape of the line segment 51a constituting of the angled slit in the modulated light filter 15.

The modulated filter 15 must serve to equalize the integrating light quantity which is emitted from the dielectric barrier discharge lamp 11 and is irradiated to each point on the surface of the substance W. When the substance W is rotated, moving speed at each point on the substance W is increased apart from the rotation center in proportional to a distance from the rotation center. Therefore, when the irradiating width of the ultraviolet light beam is constant, time, in which each point on the substance W passes the irradiating range of the ultraviolet light beam, becomes shorter in accordance with the distance from the rotation center of the substance W. In consequence, the integrating light quantity becomes lower.

Further, as illustrated in FIG. 4A, the light intensity distribution in the width direction of the dielectric barrier discharge lamp 11 has the angled shape, and is not uniform. By taking these points into consideration, the line segment 51a constituting the angled slit must be determined.

In this invention, each line segment 51a is a curve m (r) in which the extension passes near the center of the irradiating range on the basis of the center line C for the width direction of the irradiating range of the ultraviolet light beam, and is given by the following equation in a direction along the center line C so as to set the integrating light quantity E(r) substantially constant.

$$E(r) = \frac{t \cdot \int_0^{m(r)} [4 \cdot P(s)] ds}{2\pi r} \quad (1)$$

P(s): light intensity of the dielectric barrier discharge lamp;
s: a distance in a width direction from an axis line of the dielectric barrier discharge lamp;
r: a distance from the rotation center of the substance.
This basis will be explained as follows.

Now, on the assumption that the light intensity distribution of the dielectric barrier discharge lamp 11 is constant in the width direction, the integrating light quantity E, in which the substance W lineally passing at speed v [mm/sec] directly thereunder is subjected, is represented by the following equation when the distribution width of the ultraviolet light beam is a [mm] and the light intensity is P[mW/cm$^2$].

$$E=(P \times a)/v [mJ/cm^2] \quad (2)$$

In this invention, the substance W is rotated for the dielectric barrier discharge lamp 11. As a result, the moving speed is variable in dependency with the distance r [mm] from the rotation center, and is represented by the following equation if time, which is spent to rotate the substance W once, is set to t [sec].

$$v=2\pi r/t [mm/sec] \quad (3)$$

Herein, the light intensity distribution of the dielectric barrier discharge lamp actually has the angled shape, as illustrated in FIG. 4A, and therefore, functional distribution is integrated. Accordingly, if the light intensity distribution is represented by P(s) (s is the distance in the width direction from the lamp axis line), the integrating light quantity can be represented by the following equation.

$$E=\int P(s)ds/v \quad (4)$$

Figure 9:
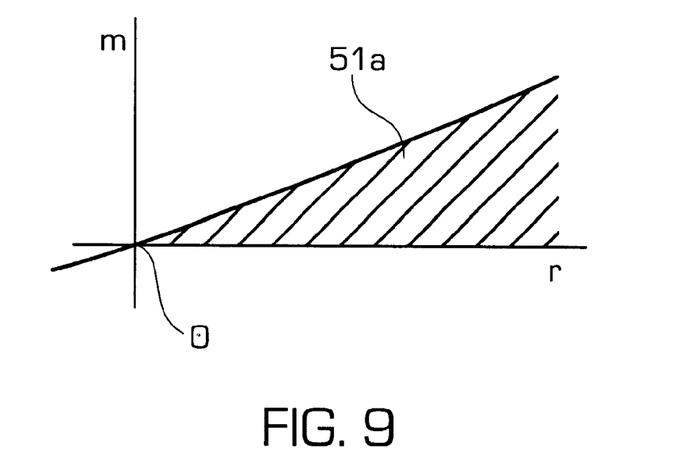
FIG. 9 is a graph showing a quadratic curve m(r) constituting of a line 51a of an angled slit.

Definite integral must be performed for this in the range corresponding to the opening width of the angled slit 51 because a partial ultraviolet light beam is shielded by the modulated light slit in this invention. Herein, the line segment 51a of the angled slit 51 is defined as the quadratic curve m (r) which passes the rotation center O of the substance W, as illustrated in FIG. 9. The light beam from the dielectric barrier discharge lamp 11 is shielded by the modulated light filter 15, and the opening width of the angled slit 51 differs in dependency upon a value of r. Accordingly, the integrating light quantity, which is subjected at each point on the substances to be processed, is determined by the definite integral from 0 to m(r).

The angled slit 51 of the modulated light filter 15 according to this invention has a fourfold size of the region 80 defined by the curve in FIG. 9. Therefore, the above-mentioned equation 1 can be obtained by making the definite integral four times.

Subsequently, description will be made about proceeding for performing washing of the substance W and modification of the surface by the ultraviolet ray irradiation apparatus 10 according to this invention with reference to FIG. 2.

On the condition that the turntable 16 falls by the elevating device 17, the gate valve 23 is released, and the substance W is carried into the process chamber 19 by a robot arm and the like (not shown). Further, the center of the substance W is corresponded with the rotation center of the turn table 16, the substance W is provided on the turntable 16, and is fixed by chuck means (not shown). Successively, the robot arm is pulled out, and the gate valve 23 is closed.

Subsequently, the turntable 16 rises to approach the substance W to the light transmitting member 13 in the lamp house 12. After air in the process chamber 19 is replaced by corrosive gas, the substance W placed on the turntable 16 is rotated by starting the rotation motor 18. The dielectric barrier discharge lamp 11 is started by continuing the rotation, and the ultraviolet light beam is irradiated for the substance W during predetermined time.

EXAMPLE

Subsequently, description will be made about an example in which the line segment 51a in the modulated light filter 15 is specifically calculated on the basis of the above-mentioned equation 1.

When the light intensity distribution was measured in the dielectric barrier discharge lamp 11 used in the ultraviolet ray irradiation apparatus, the distribution is represented by the following equation in which the light intensity of the peak point was 10 mw/cm$^2$, $$P(s)=-\tfrac{1}{250}S^2+10 \quad (5)$$

Thus, the light intensity distribution is represented by the quadratic curve, and therefore, the line segment 51a is also defined as the quadratic curve by the following equation.

$$m(r)=x \cdot r^2+y \cdot r+z \quad (6)$$

Further, values of variables x, y, z were examined, respectively, and were adopted such that the integrated light quantity E (r) defined in the above-mentioned equation 1 became constant as possible. In the example, x=0.001, y=0.3, z=0.01 were obtained, and the quadratic curve constituting the line segment 51a was defined by the following equation.

$$m(r)=0.001r^2+0.3r+0.01 \quad (7)$$

Subsequently, when the modulated light filter (example) having the light segment 51a of the quadratic curve based upon the above-mentioned equation 7 and the modulated light filter (conventional example) having the line segment of the liner shape were used, respectively, the irradiating light quantity distributions for the substances to be processed were compared by simulation.

Setting condition was set as the diameter DL of the dielectric barrier discharge lamp 11=30 mm, the length of the light emitting member 13 L$_w$=353.5 mm, the width D$_w$=90 mm, and the length of the modulated light filter 15=210 mm in the apparatus illustrated in FIG. 8.

The line segment 51a of the angled slit 51 in the example was constituted by the quadratic curve of the above-mentioned equation 1, and the line segment in the conventional example was constituted by a straight line due to the following equation.

$$m(r)=\tfrac{49}{100} \times r \quad (8)$$

Moreover, the distribution of the irradiated light quantity for the substance W in the radical direction from the rotation center O was simulated in each case. The result is represented in FIG. 10.

Figure 10:
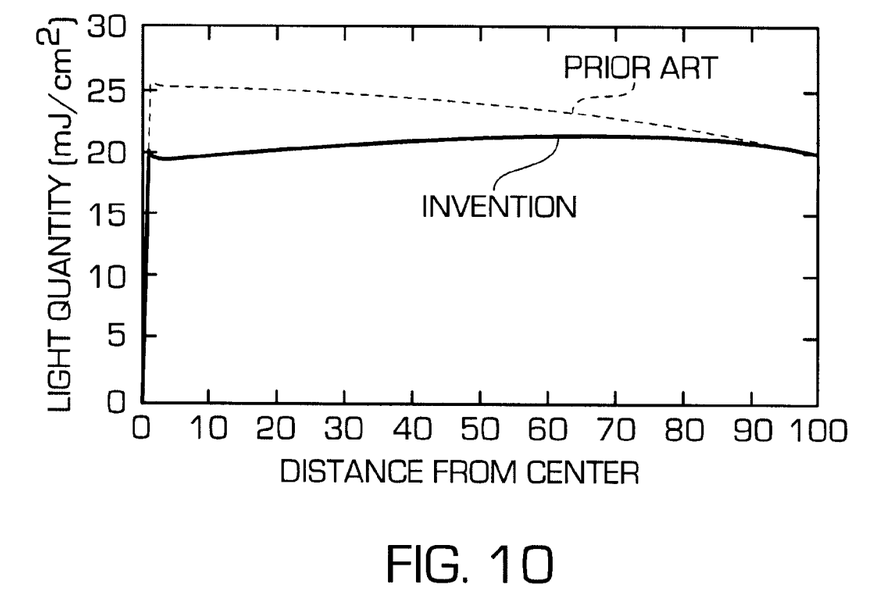
FIG. 10 is a graph which shows irradiating light quantity distribution for a substance to be processed by simulation comparing a modulated light filter having a line 51a of a quadratic curve according to this invention and a modulated light filter having a line of a linear shape.

As apparent from FIG. 10, when the modulated light filter of the conventional example was used, the irradiating light quantity gradually becomes higher, as it approaches to the rotation center.

By contrast, when the modulated light filter due to the example is used, the irradiating light quantity is substantially constant irrelevant of the positions. Subsequently, indication will be made about a result of investigation with respect to an effect of the light shielding region 52 (referring to FIG. 7) at the center in the modulated light filter 15.

Figure 11:
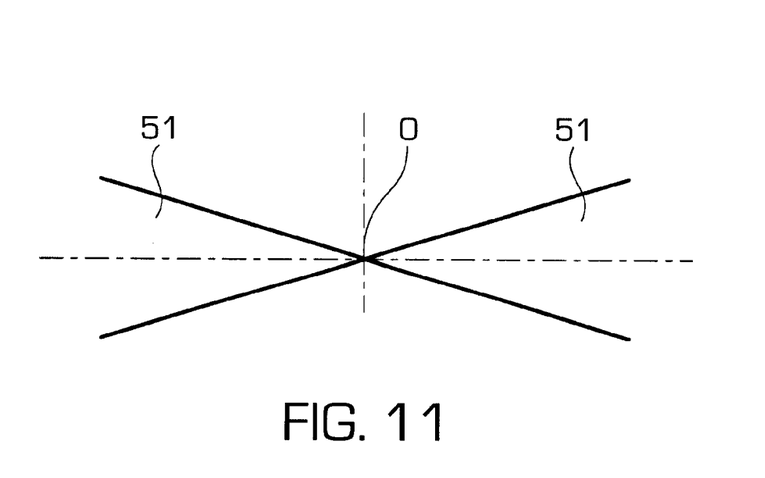
FIG. 11 is an enlarged diagram which corresponds to FIG. 7 of a modulated light filter made as a comparison to investigate an effect of a light shielding region of a modulated light filter according to this invention.

In the respective cases of the modulated light filter (example) having the light shielding region 52 at the center as illustrated in FIG. 7 in the previous setting condition and the modulated light filter (comparative example) in which the line segment 51a of the angled filter 51 is extended without providing the light shielding region and reaches the rotation center O as illustrated in FIG. 11, the irradiating light quantity for the substance to be processed was actually measured. In this event, the light shielding region 52 in the example has the width D of 15 mm.

Figure 12A:
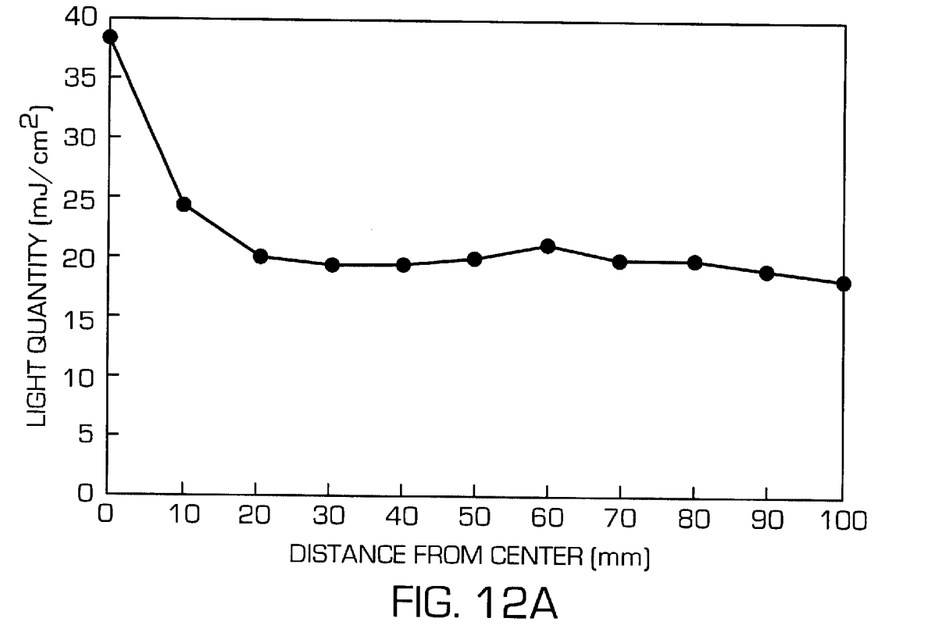
FIGS. 12A and 12B are graphs showing irradiating light quantity due to a modulated light filter according to this invention and a modulated light filter in FIG. 11.

FIG. 12A is a graph of the irradiating light quantity distribution in the case of the comparative example. In this figure, it is indicated that the irradiating light quantity near the rotation center is excessively high in comparison with the other region.

Figure 12B:
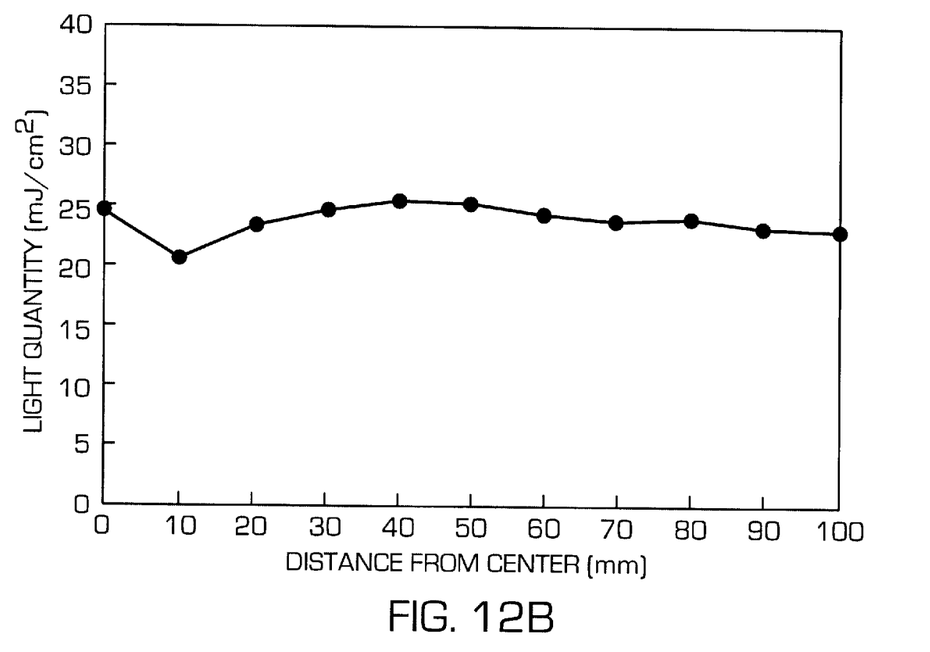

On the other hand, FIG. 12B is a graph of the irradiating light quantity distribution in the case of the example having the light shielding region 52. As apparent from this graph, the irradiating light quantity near the rotation center is effectively suppressed by the light shielding region 52, and is reduced to the substantially same quantity as the other region in the case of the example. Thereby, the effect of the light shielding region 52 has been verified.

As mentioned above, description has been made about the embodiment and the example with drawings. It is apparent that a scope applied by this invention is not restricted to the fact described by the above- mentioned embodiment. The ultraviolet beam irradiating method and apparatus according to this invention can be used for removal of organic substance contamination of a photomask made by glass for semiconductor lithography or a glass substrate for liquid crystal other than the washing for the silicon wafer or the modification of the surface.

Although the example, in which the light passing region in the modulated light filter 15 is formed by the slit, is described in this invention, the region corresponding to the angled slit 51 may be constituted by a transparent member.

Further, the region except the ultraviolet light beam passing region 71 on the light transmitting member 13 may be processed such that the ultraviolet light beam does not transmit. Moreover, although the substance W is described as the circular shape in this embodiment, substances having various kinds of shapes, which fall within the irradiating range of the dielectric barrier discharge lamp 11, can be the substance W.

As mentioned above, according to this invention, the integrating light quantity of the ultraviolet beam for the surface of the substance to be processed can approach constant, and thereby, the uniformity of the surface process can be enhanced in the ultraviolet ray irradiation apparatus which irradiates the ultraviolet light beam by relatively rotating the substance for the dielectric barrier discharge lamp.

Further, the line segments, which form the boundary in the width direction of the ultraviolet light passing region, does not reach the center of the irradiating range of the ultraviolet light beam, and are combined by adjacent line segments to each other in the width direction of the ultraviolet light beam passing region. Thereby, two ultraviolet light beam passing regions, which are apart with desired distance, are formed at the both sides of the center of the irradiating range. As a result, it can be prevented the irradiating light quantity in the rotation center from becoming high, and substantially constant light quantity can be irradiated along the entire region of the substance to be processed.

Moreover, there is provided with the process chamber which tightly covers the irradiating range of the ultraviolet light beam due to the dielectric barrier discharge lamp from the external in this invention. Thereby, it is possible to fill the corrosive gas and the like in the process chamber. As a result, the ultraviolet ray irradiation apparatus can be utilized in order to perform removal of metal contamination, removal of a natural oxide film in the integrated circuit manufacturing process, and further, vacuum ultraviolet light beam irradiation in reduced pressure ammonia gas atmosphere to remove fluorine atoms on a surface of low dielectric constant interlayer insulating film due to an organic substance containing fluorine.

What is claimed is:

1. An ultraviolet ray irradiation apparatus which performs washing and modification by irradiating an ultraviolet beam for a surface to be processed of an substance to be processed, comprising:

a dielectric barrier discharge lamp which has a length of a maximum diameter of the surface or more;

a turntable which mounts the substance such that the surface is placed under irradiation of the ultraviolet light beam irradiated by the dielectric barrier discharge lamp, a rotation center thereof substantially corresponding to a center of an irradiating range of the ultraviolet light beam due to the dielectric barrier discharge lamp;

a driving source which rotates and drives the turntable; and a filter which is fixed under the irradiation of the ultraviolet light beam due to the dielectric barrier discharge lamp and which adjusts light quantity of the ultraviolet light beam that reaches the surface of the substance in accordance with shapes of an ultraviolet beam passing region, the shape of the ultraviolet light beam passing region being symmetrical for a center line for a length direction of the irradiating range of the ultraviolet light beam, and at least a portion near a center of the irradiating range of the ultraviolet light beam of each line segment that forms a boundary of the ultraviolet light beam passing region in a width direction of the ultraviolet light beam passing region being substantially expressed by a quadratic curve that a distance r in the length direction of the irradiating range of the ultraviolet light beam on the basis of the center line is variable;

whereby, the irradiation due to the dielectric barrier discharge lamp being performed by relatively rotating the substance for the dielectric barrier discharge lamp, and thereby, the ultraviolet light beam being irradiated from the dielectric barrier discharge lamp for an entire region of the surface.

2. An ultraviolet ray irradiation apparatus as claimed in claim 1, wherein:

at least the portion near the center of the irradiating range of the ultraviolet light beam of each line segment that forms the boundary of the ultraviolet light beam passing region in the width direction of the ultraviolet light beam passing region is given by a curve m (r) which is based upon on the center line for the width direction of the irradiating range of the ultraviolet light beam and in which extension thereof passes near the center of the irradiating range, integrating light quantity E (r) given by the following equation in a direction along the center line being substantially constant, $$E(r) = \frac{t \cdot \int_0^{m(r)} [4 \cdot P(s)] ds}{2\pi r} \quad (1)$$

P(s): light intensity of the dielectric barrier discharge lamp;

s: a distance in a width direction from an axis line of the dielectric barrier discharge lamp;

r: a distance from the rotation center of the substance.

3. An ultraviolet ray irradiation apparatus as claimed in claim 1 or claim 2, wherein:

the line segments that form the boundary in the width direction of the ultraviolet light beam passing region does not reach the center of the irradiating range of the ultraviolet light beam, and are combined by adjacent line segments to each other in the width direction of the ultraviolet light beam passing region, thereby, two ultraviolet light beam passing regions apart with desired distance being formed at both sides of the center of the irradiating region.

4. An ultraviolet ray irradiation apparatus as claimed in either one of claim 1 through claim 3, wherein:

the ultraviolet light beam passing region is a slit which is opened in the filter.

5. An ultraviolet ray irradiation apparatus as claimed in either one of claim 1 through claim 4, further comprising:

at least a process chamber which tightly covers the irradiating range of the ultraviolet light beam due to the dielectric barrier discharge lamp from an external.

6. An ultraviolet ray irradiation apparatus as claimed in either one of claim 1 through claim 5, further comprising:

a body of equipment which contains at least the turn table and the driving source, an upper side thereof being opened; and a cover which is attached so as to open and close the opening for the body and which is fixed with at least the dielectric barrier discharge lamp and the filter.

7. An ultraviolet ray irradiation apparatus as claimed in claim 6, wherein:

the process chamber, which is tightly covered from the external, is formed by closing the cover for the body.

* * * * *